(12) United States Patent
Lei et al.

(10) Patent No.: US 11,882,657 B2
(45) Date of Patent: Jan. 23, 2024

(54) CIRCUIT BOARD STRUCTURE, DISPLAY PANEL, DISPLAY APPARATUS, AND MANUFACTURING METHOD THEREFOR

(71) Applicants: Chengdu BOE Optoelectronics Technology Co., Ltd., Chengdu (CN); BOE TECHNOLOGY GROUP CO., LTD., Beijing (CN)

(72) Inventors: Shuang Lei, Beijing (CN); Fei Li, Beijing (CN); Jiaxiang Wang, Beijing (CN); Bowen Xiao, Beijing (CN); Huan Meng, Beijing (CN); Binfeng Feng, Beijing (CN)

(73) Assignees: Chengdu BOE Optoelectronics Technology Co., Ltd., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 26 days.

(21) Appl. No.: 17/638,914

(22) PCT Filed: Apr. 2, 2021

(86) PCT No.: PCT/CN2021/085356
§ 371 (c)(1),
(2) Date: Feb. 28, 2022

(87) PCT Pub. No.: WO2021/218571
PCT Pub. Date: Nov. 4, 2021

(65) Prior Publication Data
US 2022/0304155 A1 Sep. 22, 2022

(30) Foreign Application Priority Data
Apr. 28, 2020 (CN) .......................... 202010352183.9

(51) Int. Cl.
*H05K 1/14* (2006.01)
*H05K 3/36* (2006.01)

(52) U.S. Cl.
CPC ............... *H05K 1/141* (2013.01); *H05K 3/36* (2013.01)

(58) Field of Classification Search
CPC ................................ H05K 1/141; H05K 3/36
(Continued)

(56) References Cited

U.S. PATENT DOCUMENTS 6,296,494 B1 * 10/2001 Yuasa .................... H05K 1/147
439/67
6,727,564 B2   4/2004 Shinomiya
(Continued)

FOREIGN PATENT DOCUMENTS

| CN | 105979696 A | 9/2016 |
| CN | 111405756 A | 7/2020 |

(Continued)

OTHER PUBLICATIONS

International Search Report dated Jul. 1, 2021 in International Application No. PCT/CN2021/085356, 4 pages.
(Continued)

*Primary Examiner* — Andargie M Aychillhum
(74) *Attorney, Agent, or Firm* — XSENSUS LLP (57) ABSTRACT

The present disclosure relates to a circuit board structure, display panel, display device and manufacturing method. The circuit board structure includes a circuit board body, a first connection part, a second connection part and a connection circuit board. An accommodating hole is disposed on the circuit board body. The first connection part is disposed on the circuit board body and located at a side of the accommodating hole. The second connection part is disposed on the circuit board body and located at a side of
(Continued)

the accommodating hole away from the first connection part. The connection circuit board is provided with a plurality of connection wires thereon, and the connection wires conductively connect the first and second connection parts. An orthographic projection of the connection circuit board on the circuit board body is not overlapped with that of the accommodating hole on the circuit board body.

18 Claims, 2 Drawing Sheets

(58) Field of Classification Search
USPC .......................................................... 361/803
See application file for complete search history.

(56) References Cited

U.S. PATENT DOCUMENTS

| | | | |
|---|---|---|---|
| 10,212,819 B2 | 2/2019 | Ahn | |
| 10,863,617 B2* | 12/2020 | Shangguan | .......... H05K 1/0254 |
| 2003/0173634 A1 | 9/2003 | Shinomiya | |
| 2016/0270234 A1* | 9/2016 | Ahn | ..................... H05K 1/0296 |
| 2019/0182960 A1 | 6/2019 | Ahn | |

FOREIGN PATENT DOCUMENTS

| | | |
|---|---|---|
| CN | 211630501 U | 10/2020 |
| EP | 1 093 326 A2 | 4/2001 |
| EP | 1 093 326 A3 | 5/2002 |
| EP | 3 068 198 A1 | 9/2016 |
| EP | 3 068 198 B1 | 5/2018 |
| EP | 3 383 147 A1 | 10/2018 |
| JP | 2011-086838 A | 4/2011 |
| KR | 100884881 B1 * | 10/2007 |

OTHER PUBLICATIONS

Written Opinion of the International Searching Authority dated Jul. 1, 2021 in International Application No. PCT/CN2021/085356, 4 pages.

* cited by examiner

FIG.4

CIRCUIT BOARD STRUCTURE, DISPLAY PANEL, DISPLAY APPARATUS, AND MANUFACTURING METHOD THEREFOR

CROSS-REFERENCE TO RELATED APPLICATIONS

The present disclosure is a national phase application under 35 U.S.C. § 371 of International Application No. PCT/CN2021/085356 filed on Apr. 2, 2021, which claims the benefit of and priority to Chinese Patent Application No. 202010352183.9, entitled "CIRCUIT BOARD STRUCTURE, DISPLAY PANEL, DISPLAY APPARATUS, AND MANUFACTURING METHOD THEREFOR" filed on Apr. 28, 2020, the entire contents of both of which are incorporated herein by reference.

TECHNICAL FIELD

The present disclosure relates to the field of display technology and, particularly, to a circuit board structure, display panel including the circuit board structure, display device including the display panel, and method for manufacturing a circuit board assembly including the circuit board structure.

BACKGROUND

At present, a mobile phone has become a necessity in people's lives, as people's daily life, work, communication, entertainment, and the like cannot by performed without a mobile phone. A battery life of the mobile phone has always been a focus of attention. One way to improve the battery life is to increase the capacity of the battery, which leads to the compression of the space for other components of the mobile phone. For example, in order to increase the battery capacity of the mobile phone, the width of a circuit board needs to be reduced, and the position of a fingerprint module needs to be changed, and thus, a hole needs to be formed in the circuit board of a display module to place the fingerprint module, so that wiring areas on both sides of the hole become narrower.

As a design rule, MIPI signal lines need to be on the same layer, and there requires a minimum width between two adjacent signal lines. Therefore, a minimum width is needed to accommodate the MIPI signal lines. Further, the wiring areas on both sides of the hole on the circuit board cannot meet the minimum width required by the signal lines, so that the signal lines, touch lines and the like on the circuit board at a side of the hole away from a connector cannot be connected to the connector through the wiring areas at both sides of the hole on the circuit board.

Therefore, it is necessary to provide a new circuit board structure, a display panel including the circuit board structure, a display device including the display panel, and a method of manufacturing a circuit board assembly including the circuit board structure.

It should be noted that the information disclosed in the above Background section is only for enhancement of understanding of the background of the present disclosure, and therefore may contain information that does not form the prior art that is already known to a person skilled in the art.

SUMMARY

The present disclosure provides a circuit board structure in which wires at both sides of a hole can be connected with each other, a display panel including the circuit board structure, a display device including the display panel, and a method for manufacturing a circuit board assembly including the circuit board structure.

An aspect of the present disclosure provides a circuit board structure, including:
a circuit board body, having an accommodating hole;
a first connection part, disposed on the circuit board body and located at a side of the accommodating hole;
a second connection part, disposed on the circuit board body and located at a side of the accommodating hole away from the first connection part; and
a connection circuit board, provided with a plurality of connection wires, the connection wires conductively connecting the first connection part and the second connection part, and an orthographic projection of the connection circuit board on the circuit board body being not overlapped with an orthographic projection of the accommodating hole on the circuit board body.

In an exemplary embodiment of the present disclosure, the circuit board structure further includes:
a third connection part, disposed at a same side of the accommodating hole as the second connection part;
a plurality of second wires, disposed on the circuit board body and located at a same side of the accommodating hole as the second connection part, at least part of the second wires being connected between the second connection part and the third connection part.

In an exemplary embodiment of the present disclosure, the second connection part is disposed between the third connection part and the accommodating hole.

In an exemplary embodiment of the present disclosure, the first connection part is one of a ZIF connector, a BTB connector, and a PCB connector, and the second connection part is one of the ZIF connector, the BTB connector and the PCB connector, and the third connection part is one of the ZIF connector, the BTB connector and the PCB connector.

In an exemplary embodiment of the present disclosure, a number of pins of the first connection part is the same as a number of pins of the second connection part, and a number of pins of the third connection part is greater than the number of the pins of the first connection part.

In an exemplary embodiment of the present disclosure, the circuit board body is provided with a first component area and a second component area, the first component area and the first connection part are disposed at a same side of the accommodating hole, the second component area and the second connection part are disposed at a same side of the accommodating hole, and the first component area and the second component area are respectively provided with a plurality of functional devices.

In an exemplary embodiment of the present disclosure, the circuit board structure further includes:
a plurality of first wires, disposed on the circuit board body and located at a same side of the accommodating hole as the first connection part, one end of each of the plurality of first wires being connected to the first connection part, and at least part of the first wires being connected between at least part of the functional devices in the first component area and the first connection part.

In an exemplary embodiment of the present disclosure, the circuit board body is provided with a bonding area, and the bonding area is located at a side parallel to a connection line between the first component area, the accommodating hole and the second component area, and a distance between an edge of the accommodating hole close to the bonding area and the bonding area is smaller than a distance between an edge of the second component area close to the bonding area and the bonding area, or the distance between the edge of the accommodating hole close to the bonding area and the bonding area is smaller than a distance between an edge of the first component area close to the bonding area and the bonding area.

In an exemplary embodiment of the present disclosure, the orthographic projection of the connection circuit board on the circuit board body is overlapped with an orthographic projection of the bonding area on the circuit board body.

In an exemplary embodiment of the present disclosure, at least part of the first wires are connected between the bonding area and the first connection part.

In an exemplary embodiment of the present disclosure, the first connection part is a plurality of first wiring pads, the second connection part is a plurality of second wiring pads, and the connection circuit board is bonded to the first connection part and the second connection part by anisotropic conductive adhesive.

An aspect of the present disclosure provides a display panel, including any one of the circuit board structures described above.

An aspect of the present disclosure provides a display device, including any one of the display panels describes above.

An aspect of the present disclosure provides a method for manufacturing a circuit board assembly, including:
  providing a circuit board body having an accommodating hole;
  connecting a first connection part to the circuit board body, the first connection part being located at a side of the accommodating hole;
  connecting a second connection part to the circuit board body, the second connection part being located at a side of the accommodating hole away from the first connection part;
  providing a second circuit board and bonding a bonding area of the circuit board body with the second circuit board;
  providing a connection circuit board provided with a plurality of connection wires, and connecting the connection circuit board between the first connection part and the second connection part, so that the connection wires conductively connects the first connection part and the second connection part, and an orthographic projection of the connection circuit board on the circuit board body is not overlapped with an orthographic projection of the accommodating hole on the circuit board body.

It should be understood that the above general description and the following detailed description are only exemplary and explanatory, and cannot limit the present disclosure.

BRIEF DESCRIPTION OF THE DRAWINGS

The accompanying drawings, which are incorporated in and constitute a part of this specification, illustrate embodiments in accordance with the present disclosure, and together with the description, serve to explain the principle of the present disclosure. Understandably, the drawings in the following description are only some embodiments of the present disclosure, and for a person skilled in the art, other drawings may also be obtained from these drawings without creative efforts.

DETAILED DESCRIPTION

Example embodiments will now be described more fully with reference to the accompanying drawings. However, example embodiments may be embodied in various forms and should not be construed as limited to the embodiments set forth herein; rather, these embodiments are provided so that the present disclosure will be thorough and complete, and will fully convey the concept of example embodiments to a person skilled in the art. The same reference numerals in the drawings denote the same or similar structures, and thus their detailed descriptions will be omitted. Furthermore, the drawings are merely schematic illustrations of the present disclosure and are not necessarily drawn to scale.

Figure 1:
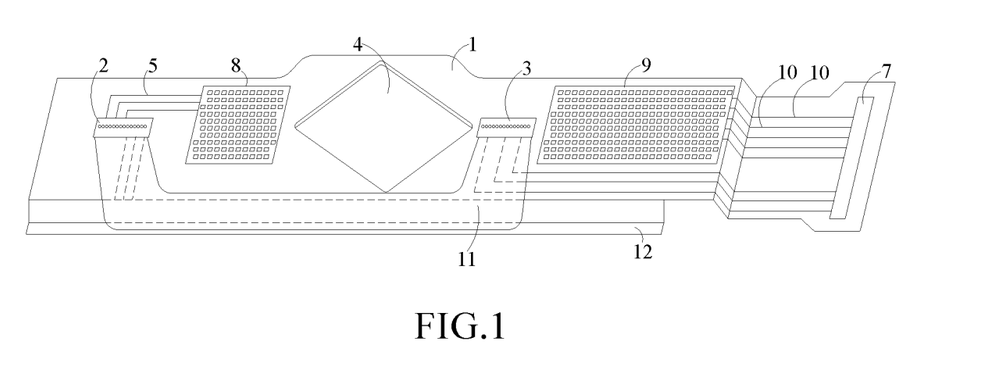
FIG. 1 is a schematic three-dimensional structural diagram of a circuit board structure according to an exemplary embodiment of the present disclosure.

The present disclosure first provides a circuit board structure. FIG. 1 is a schematic three-dimensional structure diagram of a circuit board structure according to an exemplary embodiment of the of the present disclosure. As shown in FIG. 1, a first wire 5, a second wire 6 and a third wire 10 are drawn to be above a circuit board body for the convenience of understanding, but in an actual product, since the circuit board structure may be a multi-layer printed circuit board, the first wire 5, the second wire 6 and the third wire 10 may be arranged on any layer as required. The circuit board structure may include a circuit board body 1, a first connection part 2, a second connection part 3, a connection circuit board 11, a plurality of first wires 5 and a plurality of second wires 6. An accommodating hole 4 is disposed on the circuit board body 1. The first connection part 2 is disposed on the circuit board body 1 and located at a side of the accommodating hole 4. The plurality of first wires 5 are disposed on the circuit board body 1, located at the same side of the accommodating hole 4 as the first connection part 2, and connected to the first connection part 2. The second connection part 3 is disposed on the circuit board body 1 and located at a side of the accommodating hole 4 away from the first connection part 2. The plurality of second wires 6 are disposed on the circuit board body 1, located at the same side of the accommodating hole 4 as the second connection part 3, and connected with the second connection part 3. The connection circuit board 11 is provided with a plurality of connection wires 111 thereon, and the connection wires 111 conductively connect the first connection part 2 and the second connection part 3. An orthographic projection of the connection circuit board 11 on the circuit board body 1 is not overlapped with an orthographic projection of the accommodating hole 4 on the circuit board body 1.

The first wire 5 and the second wire 6 on both sides of the accommodating hole 4 are connected together through the connection circuit board 11, which avoid disposing the connection wire 111 at the accommodating hole 4. The connection circuit board 11 is disposed separately and is not affected by the width of the circuit board body 1, the width of the connection circuit board 11 may be disposed to be relatively wide, and the width of the connection wire 111 on the connection circuit board 11 does not need to be reduced, which makes the resistance of the connection wire 111 smaller and thus the connection wire 111 safer.

In an exemplary embodiment, the circuit board body 1 may be a flexible circuit board or a rigid printed circuit board. Referring to the three-dimensional schematic diagram of the circuit board body shown in FIG. 2, the number and the wiring way of the first wire 5, the second wire 6 and the third wire 10 in the figure are only schematically drawn for the convenience of understanding, which is not intended to limit the actual number and actual wiring way thereof. The circuit board body 1 may be provided in a rectangular shape. The circuit board body 1 is provided with the accommodating hole 4 thereon, and a fingerprint identification module may be placed in the accommodating hole 4. The accommodating hole 4 may be a through hole or a blind hole, which may be provided as required. The radial dimension of the accommodating hole 4 is slightly smaller than the width of the circuit board body 1, so that a wire cannot be disposed on two sides of the accommodating hole 4 in the width direction of the circuit board body 1, and thus the wires at two sides of the accommodating hole 4 in the length direction of the circuit board body 1 cannot be connected. In addition, the circuit board body 1 may not be rectangular, and may be any other shape, as long as the circuit board body 1 is provided with the accommodating hole 4, and the remaining area of the circuit board body 1 at opposite sides of the accommodating hole 4 is not enough to dispose the connection wire 111 to connect the wires at the other opposite sides of the accommodating hole 4.

Figure 2:
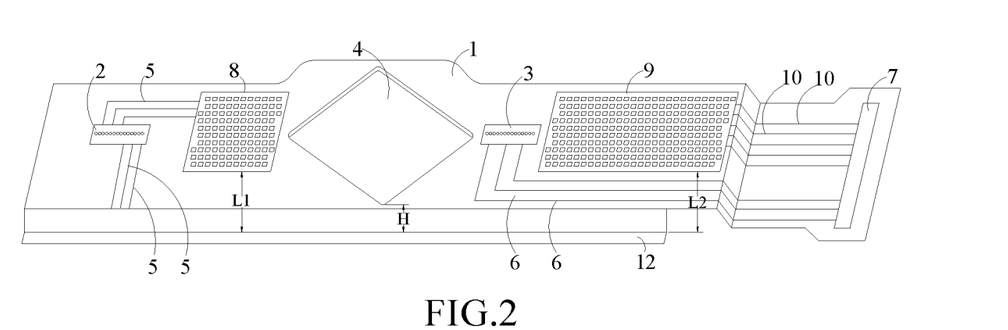
FIG. 2 is a schematic three-dimensional structure diagram of a circuit board body in FIG. 1.

In an exemplary embodiment, the first connection part 2 and the second connection part 3 are disposed on the circuit board body 1, the first connection part 2 is located at a side of the accommodating hole 4, and the second connection part 3 is at a side of the accommodating hole 4 away from the first connection part 2, that is, the first connection part 2 and the second connection part 3 are located on opposite sides of the accommodating hole 4.

The circuit board body 1 is further provided with the plurality of first wires 5 thereon, and the plurality of first wires 5 are located at the same side of the accommodating hole 4 as the first connection part 2 and connected to the first connection part 2. For example, an end of each of a part of the first wires 5 is connected to a bonding area 12, and the opposite end thereof is connected to the first connection part 2. Ends of a part of the first wires 5 are connected to at least part of functional devices in a first component area 8, and opposite ends thereof are connected to the first connection part 2. The circuit board body 1 is further provided with the plurality of second wires 6, and the plurality of second wires 6 are located at the same side of the accommodating hole 4 as the second connection part 3 and connected to the second connection part 3.

In an exemplary embodiment, the first connection part 2 may be a ZIF (zero insertion force) connector, or a BTB (board-to-board) connector or a PCB (printed circuit board) connector or the like. The second connection part 3 may be the ZIF connector, or the BTB connector or the PCB connector or the like.

The longitudinal direction of the first connection part 2 is the same as the longitudinal direction of the circuit board body 1. The longitudinal direction of the second connection part 3 is the same as the longitudinal direction of the circuit board body 1. Of course, the length direction of the first connection part 2 may be the same as the width direction of the circuit board body 1. The longitudinal direction of the second connection part 3 may also be the same as the width direction of the circuit board body 1. The first connection part 2 and the second connection part 3 may also be inclined relative to the circuit board body 1.

In an exemplary embodiment, the circuit board body 1 is provided with a first component area 8 and a second component area 9 thereon, and the first component area 8 and the second component area 9 are respectively provided with a plurality of functional devices. The first component area 8 is located at a side of the accommodating hole 4, and the second component area 9 is located at a side of the accommodating hole 4 away from the first component area 8, namely the first component area 8 and the second component area 9 are located at opposite sides of the accommodating hole 4.

The first component area 8 and the first connection part 2 are arranged at a same side of the accommodating hole 4, and the second component area 9 and the second connection part 3 are arranged at a same side of the accommodating hole 4. Specifically, the first connection part 2 is located at a side of the first component area 8 away from the accommodating hole 4, that is, the first component area 8 is located between the first connection part 2 and the accommodating hole 4. The second connection part 3 is located between the accommodating hole 4 and the second component area 9. Of course, in another example embodiment of the present disclosure, the first connection part 2 may also be provided between the first component area 8 and the accommodating hole 4, and the second component area 9 may also be provided between the accommodating hole 4 and the second connection parts 3.

In an exemplary embodiment, at least part of the first wires 5 are connected between at least part of the functional devices in the first component area 8 and the first connection part 2, that is, at least part of the functional devices in the first component area 8 are connected to the first connection part 2 through at least part of the first wires 5, and transmits a signal to the first connection part 2 through the first wire 5, to the connection wire 111 through the first connection part 2, and then to the second connection part 3 and the second wire 6 sequentially.

In addition, it should be noted that circuit board body pins may also be disposed in the bonding area 12 of the circuit board body 1, and a part of the first wires 5 are connected to the circuit board body pins. The first wires 5 may be connected to an external circuit outside the circuit board body 1 through the circuit board body pins. When the circuit board structure is in an operating state, a conduction path of an electrical signal is the circuit board body pins, the first wire 5, the first connection part 2, the connection wire 111, the second connection part 3, and the second wire 6 sequentially. Of course, a reverse path in sequence may be possible.

In an exemplary embodiment, the circuit board structure may further include a third connection part 7, and the third connection part 7 and the second connection part 3 are disposed at a same side of the accommodating hole 4. Specifically, the third connection part 7 is disposed at a side of the second component area 9 away from the second connection part 3, and the third connection part 7 is located at an edge of the circuit board body 1. The third connection part 7 is used for connecting with an external circuit, to transmit a signal of the circuit board body 1 to the outside, or transmit an external signal to the circuit board body 1. The longitudinal direction of the third connection part 7 is the same as the width direction of the circuit board body 1. The second wire 6 is connected between the third connection part 7 and the second connection part 3.

It should also be noted that the plurality of functional devices in the second component area 9 may be connected to the third connection part 7 through the third wire 10. The third connection part 7 may be a ZIF connector, or a BTB connector, or a PCB connector, or the like. Therefore, the number of pins of the first connection part 2 may be the same as the number of pins of the second connection part 3, and the number of pins of the third connection part 7 may be greater than the number of pins of the first connection part 2.

In an exemplary embodiment, the connection circuit board 11 may also be a flexible circuit board or a rigid printed circuit board. Referring to the schematic structural diagram of the connection circuit board shown in FIG. 3, the number and the wiring ways of the connection wires 111 in the figure are only schematically drawn for the convenience of understanding, which is not intended to limit the actual number and actual wiring ways thereof. The plurality of connection wires 111 are disposed on the connection circuit board 11, and the plurality of connection wires 111 may include MIPI signal lines, touch signal lines and the like. One end of the connection circuit board 11 is connected to the first connection part 2, the other end of the connection circuit board 11 is connected to the second connection part 3, and the connection wire 111 on the connection circuit board 11 conductively connect the first wire 5 connected with the first connection part 2 and the second wire 6 connected with the second connection part 3.

The mounted connection circuit board 11 may be parallel to the circuit board body 1. The orthographic projection of the connection circuit board 11 on the circuit board body 1 is not overlapped with the orthographic projection of the accommodating hole 4 on the circuit board body 1, so as to prevent the connection circuit board 11 from blocking the accommodating hole 4. Therefore, after a fingerprint identification module is installed in the accommodating hole 4, the operation of the fingerprint recognition module is not affected.

In an exemplary embodiment, the circuit board body 1 is further provided with the bonding area 12 thereon, the circuit board body 1 may be a multi-layer printed circuit board, and the bonding area 12 may be provided on the lowermost layer of the circuit board body 1. The bonding area 12 is located at a side parallel to a connection line between the first component area 8, the accommodating hole 4 and the second component area 9, that is, the bonding area 12 is located at the long side of the circuit board body 1.

A distance H between an edge of the accommodating hole 4 close to the bonding area 12 and the bonding area 12 is smaller than a distance L2 between an edge of the second component area 9 close to the bonding area 12 and the bonding area 12, or the distance H between the edge of the accommodating hole 4 close to the bonding area 12 and the bonding area 12 is smaller than a distance L1 between an edge of the first component area 8 close to the bonding area 12 and the bonding area 12. That is, the distance between the accommodating hole 4 and the bonding area 12 is the smallest, and the wiring cannot be disposed thereon.

The mounted connection circuit board 11 may be parallel to the circuit board body 1. The orthographic projection of the connection circuit board 11 on the circuit board body 1 is overlapped with the orthographic projection of the bonding area 12 on the circuit board body 1, so that the connection circuit board 11 may be made wider enough to accommodate the plurality of connection wires 111.

Figure 3:
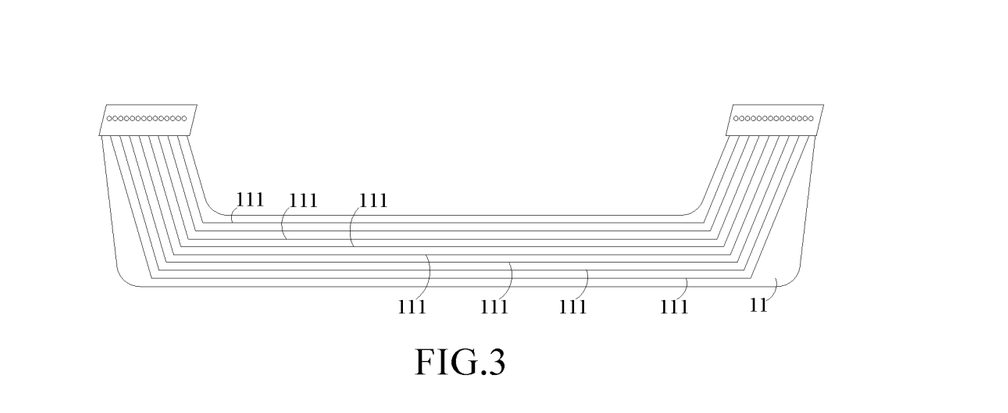
FIG. 3 is a schematic structural diagram of a connection circuit board in FIG. 1.

In addition, in another example embodiment of the present disclosure, the first connection part 2 may also be a plurality of first wiring pads, and the plurality of first wiring pads are connected to the plurality of first wires 5 in a one-to-one correspondence. The second connection part 3 may also be a plurality of second wiring pads, and the plurality of second wiring pads are connected to the plurality of second wires 6 in a one-to-one correspondence. Two ends of the connection circuit board 11 are respectively provided with a plurality of first connection wiring pads and a plurality of second connection wiring pads. The connection circuit board 11 may be bonded to the first connection part 2 and the second connection part 3 by anisotropic conductive adhesive, so that the first connection wiring pad and the first wiring pad are conductively bonded, and the second connection wiring pad and the second wiring pad are conductively bonded. The anisotropic conductive adhesive is a conductive adhesive with unidirectional conduction (vertical conduction, parallel non-conduction) and bonding functions. The use of ZIF connector, BTB connector or PCB connector is avoided, which may reduce a height after the circuit board body 1 is connected to the connection circuit board 11, and facilitate the subsequent slim design of the display panel.

Further, the present disclosure also provides a display panel, which may include the above-mentioned circuit board structure. The specific structure of the circuit board structure has been described in detail above, and therefore will not be repeated here.

The display panel may be a liquid crystal display panel, an LED display panel, an OLED display panel, and the like, and the display panel may further include a light-emitting part, an array substrate, a color filter substrate, and the like.

Compared with the prior art, the beneficial effects of the display panel provided by the embodiments of the present disclosure are the same as those of the circuit board structure provided by the above-mentioned embodiments, which are not repeated here.

Further, the present disclosure also provides a display device, which may include the above-mentioned display panel. The specific structure of the display panel has been described in detail above, and therefore will not be repeated here.

The specific type of the display device is not particularly limited, and any type of display device commonly used in the art may be used, such as OLED displays, mobile devices such as mobile phones, wearable devices such as watches, VR devices, and the like, which may be selected according to the specific purpose of the display device, and details of which are not repeated here.

It should be noted that in addition to the display panel, the display device also includes other necessary parts and components. Taking a display as an example, for example, a casing, a circuit board, a power cord, and the like may be included. The parts and components may be added by a person skilled in the art according to specific usage requirements, which will not be repeated here.

Compared with the prior art, the beneficial effects of the display device provided by the embodiments of the present disclosure are the same as those of the display panel provided by the above-mentioned embodiments, which are not repeated here.

Figure 4:
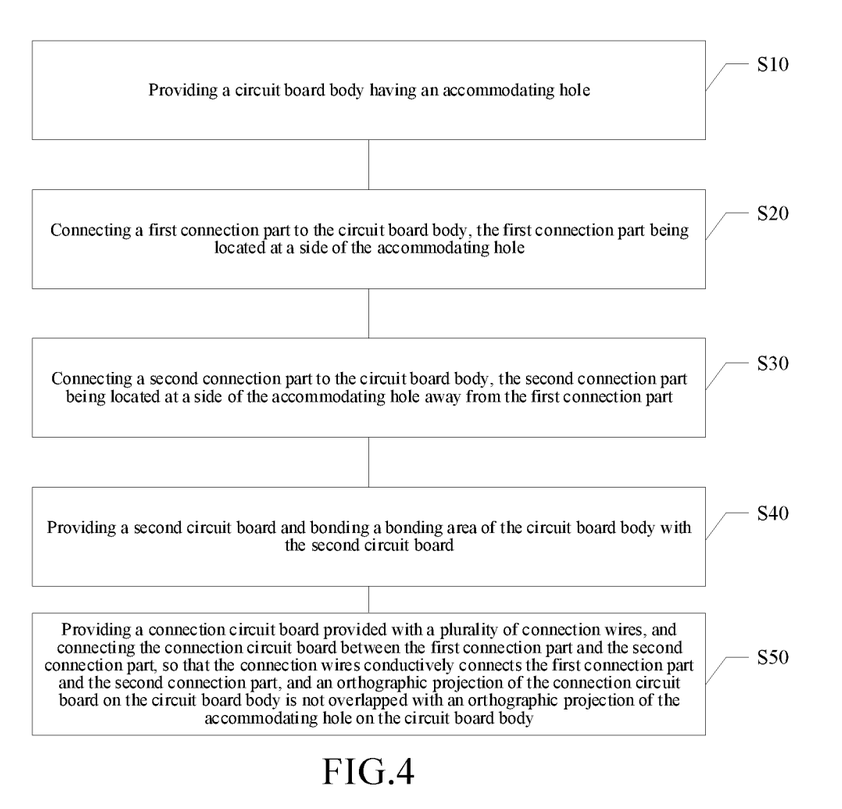
FIG. 4 is a schematic flowchart of a method for manufacturing a circuit board assembly according to the present disclosure.

Further, the present disclosure also provides a method for manufacturing a circuit board assembly. FIG. 4 is a schematic flowchart of a method for manufacturing a circuit board assembly according to the present disclosure. As shown in FIG. 4, the method for manufacturing a circuit board assembly may include:

step S10, providing a circuit board body 1 having an accommodating hole 4;

step S20, connecting a first connection part 2 to the circuit board body 1, the first connection part 2 being located at a side of the accommodating hole 4;

step S30, connecting a second connection part 3 to the circuit board body 1, the second connection part 3 being located at a side of the accommodating hole 4 away from the first connection part 2;

step S40, providing a second circuit board and bonding a bonding area 12 of the circuit board body 1 with the second circuit board;

step S50, providing a connection circuit board 11 provided with a plurality of connection wires 111, and connecting the connection circuit board 11 between the first connection part 2 and the second connection part 3, so that the connection wires 111 conductively connects the first connection part 2 and the second connection part 3, and an orthographic projection of the connection circuit board 11 on the circuit board body 1 is not overlapped with an orthographic projection of the accommodating hole 4 on the circuit board body 1.

A large amount of heat is generated during bonding, which will have adverse effects the wires and components on the circuit board body 1 and the connection circuit board 11. Therefore, it is inappropriate to arrange wires and components on the part of the circuit board body 1 close to the bonding area 12. First bonding and then connecting the connection circuit board 11 may ensure that the wires on the connection circuit board 11 will not be affected by the heat generated by the bonding.

After the bonding area 12 of the circuit board body 1 is bonded to the second circuit board, a part of the first wires 5 on the circuit board body 1 may also be connected to the second circuit board in a conductive manner.

The features, structures or characteristics described above may be combined in any suitable manner in one or more embodiments and, where possible, the features discussed in the various embodiments are interchangeable. In the above description, numerous specific details are provided in order to provide a thorough understanding of the embodiments of the present disclosure. However, a person skilled in the art will appreciate that the technical solutions of the present disclosure may be practiced without one or more of the specific details, or with other methods, components, materials, and the like. In other instances, well-known structures, materials, or operations are not shown or described in detail to avoid obscuring aspects of the present disclosure.

Although relative terms such as "upper" and "lower" are used in the specification to describe the relative relationship of one component to another component shown, these terms are used in the specification only for convenience of description for example according to the example direction shown in the figures. It will be appreciated that if a device shown is turned upside down, the component described as "upper" will become the component as "lower". When a certain structure is "on" another structure, it may mean that the structure is integrally formed on said another structure, or that the structure is arranged "directly on" said another structure, or that the certain structure is arranged "indirectly on" said another structure through an additional structure.

The terms "a", "an", "the", "said" and "at least one" are used to indicate the presence of one or more elements/components/etc.; the terms "comprise", "include" and "have" are used to indicate an open-ended inclusive means and means that additional elements/components/etc. may be present in addition to the listed elements/components/etc. The terms "first," "second," and "third" and the like are used only as labels and are not intended to limit the number of objects.

It should be understood that the present disclosure does not limit the application thereof to the detailed structure and arrangement of components set forth in the specification. The present disclosure may have other embodiments and may be implemented and embodied in various ways. The foregoing variations and modifications fall within the scope of the present disclosure. It will be understood that the present disclosure disclosed and defined in the specification extends to all alternative combinations of two or more of the individual features mentioned or evident in the text and/or drawings. All of these different combinations constitute various alternative aspects of the present disclosure. The embodiments described in the specification illustrate the best implementation known for carrying out the present disclosure, and will enable a person skilled in the art to utilize the present disclosure.

What is claimed is:

1. A circuit board structure, comprising:
   a circuit board body having an accommodating hole;
   a first connection part disposed on the circuit board body, and located at a side of the accommodating hole;
   a second connection part disposed on the circuit board body, and located at a side of the accommodating hole away from the first connection part; and
   a connection circuit board provided with a plurality of connection wires, the connection wires conductively connecting the first connection part and the second connection part, and an orthographic projection of the connection circuit board on the circuit board body being not overlapped with an orthographic projection of the accommodating hole on the circuit board body,
   wherein the circuit board structure further comprises:
   a third connection part disposed at a same side of the accommodating hole as the second connection part; and
   a plurality of second wires disposed on the circuit board body and located at a same side of the accommodating hole as the second connection part, at least part of the second wires being connected between the second connection part and the third connection part.

2. The circuit board structure according to claim 1, wherein the second connection part is disposed between the third connection part and the accommodating hole.

3. The circuit board structure according to claim 1, wherein the first connection part is one of a ZIF connector, a BTB connector, and a PCB connector, and the second connection part is one of the ZIF connector, the BTB connector and the PCB connector, and the third connection part is one of the ZIF connector, the BTB connector and the PCB connector.

4. The circuit board structure according to claim 3, wherein a number of pins of the first connection part is the same as a number of pins of the second connection part, and a number of pins of the third connection part is greater than the number of the pins of the first connection part.

5. The circuit board structure according to claim 1, wherein the circuit board body is provided with a first component area and a second component area, the first component area and the first connection part are disposed at a same side of the accommodating hole, the second component area and the second connection part are disposed at a same side of the accommodating hole, and the first component area and the second component area are respectively provided with a plurality of functional devices.

6. The circuit board structure according to claim 5, further comprising:
a plurality of first wires, disposed on the circuit board body and located at a same side of the accommodating hole as the first connection part, one end of each of the plurality of first wires being connected to the first connection part, and at least part of the first wires being connected between at least part of the functional devices in the first component area and the first connection part.

7. The circuit board structure according to claim 6, wherein the circuit board body is provided with a bonding area, and the bonding area is located at a side parallel to a connection line between the first component area, the accommodating hole and the second component area, and
a distance between an edge of the accommodating hole close to the bonding area and the bonding area is smaller than a distance between an edge of the second component area close to the bonding area and the bonding area, or the distance between the edge of the accommodating hole close to the bonding area and the bonding area is smaller than a distance between an edge of the first component area close to the bonding area and the bonding area.

8. The circuit board structure according to claim 7, wherein the orthographic projection of the connection circuit board on the circuit board body is overlapped with an orthographic projection of the bonding area on the circuit board body.

9. The circuit board structure according to claim 7, wherein at least part of the first wires are connected between the bonding area and the first connection part.

10. The circuit board structure according to claim 1, wherein the first connection part is a plurality of first wiring pads, the second connection part is a plurality of second wiring pads, and the connection circuit board is bonded to the first connection part and the second connection part by anisotropic conductive adhesive.

11. A display panel, comprising:
a circuit board structure, wherein the circuit board structure comprises:
a circuit board body having an accommodating hole;
a first connection part disposed on the circuit board body, and located at a side of the accommodating hole;
a second connection part disposed on the circuit board body, and located at a side of the accommodating hole away from the first connection part; and
a connection circuit board provided with a plurality of connection wires, the connection wires conductively connecting the first connection part and the second connection part, and an orthographic projection of the connection circuit board on the circuit board body being not overlapped with an orthographic projection of the accommodating hole on the circuit board body,
wherein the circuit board structure further comprises:
a third connection part disposed at a same side of the accommodating hole as the second connection part; and
a plurality of second wires disposed on the circuit board body and located at a same side of the accommodating hole as the second connection part, at least part of the second wires being connected between the second connection part and the third connection part.

12. A display device, comprising the display panel of claim 11.

13. The display panel according to claim 11, wherein the second connection part is disposed between the third connection part and the accommodating hole.

14. The display panel according to claim 11, wherein the first connection part is one of a ZIF connector, a BTB connector, and a PCB connector, and the second connection part is one of the ZIF connector, the BTB connector and the PCB connector, and the third connection part is one of the ZIF connector, the BTB connector and the PCB connector.

15. The display panel according to claim 14, wherein a number of pins of the first connection part is the same as a number of pins of the second connection part, and a number of pins of the third connection part is greater than the number of the pins of the first connection part.

16. The display panel according to claim 11, wherein the circuit board body is provided with a first component area and a second component area, the first component area and the first connection part are disposed at a same side of the accommodating hole, the second component area and the second connection part are disposed at a same side of the accommodating hole, and the first component area and the second component area are respectively provided with a plurality of functional devices.

17. The display panel according to claim 16, wherein the circuit board structure further comprises:
a plurality of first wires disposed on the circuit board body and located at a same side of the accommodating hole as the first connection part, one end of each of the plurality of first wires being connected to the first connection part, and at least part of the first wires being connected between at least part of the functional devices in the first component area and the first connection part.

18. A method for manufacturing a circuit board assembly, comprising:
providing a circuit board body having an accommodating hole;
connecting a first connection part to the circuit board body, the first connection part being located at a side of the accommodating hole;
connecting a second connection part to the circuit board body, the second connection part being located at a side of the accommodating hole away from the first connection part;
providing a second circuit board and bonding a bonding area of the circuit board body with the second circuit board;
providing a connection circuit board provided with a plurality of connection wires, and connecting the connection circuit board between the first connection part and the second connection part, so that the connection wires conductively connects the first connection part and the second connection part, and an orthographic projection of the connection circuit board on the circuit board body is not overlapped with an orthographic projection of the accommodating hole on the circuit board body,
wherein the method further comprises:
providing a third connection part disposed at a same side of the accommodating hole as the second connection part; and
providing a plurality of second wires disposed on the circuit board body and located at a same side of the accommodating hole as the second connection part, at least part of the second wires being connected between the second connection part and the third connection part.

\* \* \* \* \*